(12) United States Patent
Park et al.

(10) Patent No.: US 9,136,433 B2
(45) Date of Patent: Sep. 15, 2015

(54) LIGHT EMITTING DIODE

(71) Applicant: GWANGJU INSTITUTE OF SCIENCE AND TECHNOLOGY, Gwangju (KR)

(72) Inventors: Seong-Ju Park, Gwangju (KR); Jae-Joon Kim, Gwangju (KR); Youngchul Leem, Gwangju (KR)

(73) Assignee: GWANGJU INSTITUTE OF SCIENCE AND TECHNOLOGY, Gwangju (KR)

( * ) Notice: Subject to any disclaimer, the term of this patent is extended or adjusted under 35 U.S.C. 154(b) by 0 days.

(21) Appl. No.: 14/502,597

(22) Filed: Sep. 30, 2014

(65) Prior Publication Data

US 2015/0091036 A1 Apr. 2, 2015

(30) Foreign Application Priority Data

Oct. 1, 2013 (KR) ........................ 10-2013-0117150

(51) Int. Cl.
*H01L 33/46* (2010.01)
*H01L 33/58* (2010.01)
*H01L 33/14* (2010.01)

(52) U.S. Cl.
CPC ................ *H01L 33/14* (2013.01); *H01L 33/46* (2013.01); *H01L 33/58* (2013.01)

(58) Field of Classification Search
CPC ......... H01L 33/10; H01L 33/14; H01L 33/46; H01L 33/60

USPC .................... 257/E33.062, E33.067, E33.068
See application file for complete search history.

(56) References Cited

U.S. PATENT DOCUMENTS

| | | | |
|---|---|---|---|
| 7,489,068 B2* | 2/2009 | Hsieh et al. | 313/116 |
| 7,755,098 B2* | 7/2010 | Park et al. | 257/98 |
| 8,188,463 B2* | 5/2012 | Aurongzeb et al. | 257/40 |
| 8,779,411 B2* | 7/2014 | Lee et al. | 257/13 |
| 2006/0186432 A1* | 8/2006 | Osipov et al. | 257/103 |
| 2009/0256148 A1* | 10/2009 | Park et al. | 257/43 |
| 2011/0114924 A1* | 5/2011 | Aurongzeb et al. | 257/40 |
| 2011/0254019 A1* | 10/2011 | Hsu | 257/77 |
| 2012/0085987 A1* | 4/2012 | Xuan et al. | 257/13 |
| 2012/0098024 A1* | 4/2012 | Hsu et al. | 257/99 |
| 2012/0326189 A1* | 12/2012 | Lee et al. | 257/98 |
| 2013/0313591 A1* | 11/2013 | Shimada et al. | 257/98 |
| 2015/0091036 A1* | 4/2015 | Park et al. | 257/98 |
| 2015/0179880 A1* | 6/2015 | Fang et al. | 257/76 |

* cited by examiner

*Primary Examiner* — Earl Taylor
(74) *Attorney, Agent, or Firm* — Lowe Hauptman & Ham, LLP

(57) ABSTRACT

Disclosed herein is a light emitting diode. The light emitting diode includes a substrate, an n-type semiconductor layer placed on the substrate, an active layer placed on the n-type semiconductor layer, a p-type semiconductor layer placed on the active layer, a reflective layer placed on the p-type semiconductor layer, an n-type electrode electrically connected to the n-type semiconductor layer, a p-type electrode placed on the reflective layer; and a first patterned magnetic structure placed on the reflective layer, and separated from the p-type electrode. The light emitting diode can provide improved internal quantum efficiency using the patterned magnetic structure.

12 Claims, 13 Drawing Sheets

LIGHT EMITTING DIODE

CROSS-REFERENCE TO RELATED APPLICATION

This application claims priority to Korean Patent Application No. 10-2013-0117150 filed on 1 Oct. 2013, and all the benefits accruing therefrom under 35 U.S.C. §119, the contents of which is incorporated by reference in its entirety.

BACKGROUND

1. Technical Field

The present invention relates to a light emitting diode, and more particularly, to a light emitting diode having improved internal quantum efficiency using a magnetic field.

2. Description of the Related Art

A light emitting diode (LED) is a kind of p-n junction diode and is a semiconductor device using electroluminescence, in which monochromatic light is emitted when forward voltage is applied to the semiconductor device.

The light emitting diode is operated to generate light when voltage is applied between two electrodes, that is, a cathode and an anode, to supply electric current. In particular, an n-type semiconductor layer and a p-type semiconductor layer are placed on upper and lower sides of an active layer having a multi-quantum well structure, respectively. The n-type semiconductor layer supplies electrons to the active layer, while the p-type semiconductor layer supplies holes to the active layer. Electrons and holes introduced into the multi-quantum well structure are defined within quantum well layers by quantum confinement, and recombined with each other, thereby generating light.

Nitride compound semiconductors, represented by gallium nitride (GaN), have received much attention in the field of high power electronic devices including LEDs, since they have high thermal stability and a wide range of band-gap from 0.8 eV to 6.2 eV.

In a GaN-based light emitting diode, use of a magnetic field has been proposed in order to improve quantum efficiency.

However, the active layer is not sufficiently thick for linear motion of charge carriers to be converted into cyclotron motion by an external magnetic field.

In order to address this problem, a magnetic field is applied to the active layer through a magnetic layer grown directly in the light emitting diode.

However, a non-uniform magnetic field applied by the magnetic layer is present over a very wide range and thus does not have a significant influence on the motion of charge carriers.

BRIEF SUMMARY

It is an aspect of the present invention to provide a light emitting diode having improved internal quantum efficiency using a patterned magnetic structure.

In accordance with one aspect of the present invention, a light emitting diode is provided. The light emitting diode may include a substrate, an n-type semiconductor layer placed on the substrate, an active layer placed on the n-type semiconductor layer, a p-type semiconductor layer placed on the active layer, an n-type electrode electrically connected to the n-type semiconductor layer, a p-type electrode placed on the p-type semiconductor layer and electrically connected thereto, and a patterned magnetic structure placed on the p-type semiconductor layer and separated from the p-type electrode.

The first patterned magnetic structure may include at least one ferromagnetic material selected from among Co, Fe, Ni, Gd, Dy, NdFeB, and alloys thereof.

The first patterned magnetic structure may include a line pattern, hole pattern, or dot pattern.

The first patterned magnetic structure may be subjected to magnetization annealing.

The first patterned magnetic structure may be magnetized in a direction perpendicular or parallel to the substrate.

At least one of the n-type semiconductor layer and the p-type semiconductor layer may include a ferromagnetic material.

The ferromagnetic material may include at least one selected form the group consisting of Co, Fe, Ni, and Mn.

The light emitting diode may further include a second magnetic structure placed under the substrate.

The second magnetic structure may have a patterned structure.

In accordance with another aspect of the present invention, a light emitting diode is provided. The light emitting diode may include a support substrate, a first patterned to magnetic structure placed on the support substrate, a p-type electrode placed on the support substrate exposed between patterns of the first patterned magnetic structure, a reflective layer placed on the first patterned magnetic structure and the p-type electrode, a p-type semiconductor layer placed on the reflective layer, an active layer placed on the p-type semiconductor layer, an n-type semiconductor layer placed on the active layer, and an n-type electrode electrically connected to the n-type semiconductor layer.

The first patterned magnetic structure may include at least one ferromagnetic material selected from among Co, Fe, Ni, Gd, Dy, NdFeB, and alloys thereof.

The first patterned magnetic structure may be subjected to magnetization annealing.

According to the present invention, a light emitting diode having improved internal quantum efficiency using a patterned magnetic structure can be provided.

In addition, the light emitting diode includes a ferromagnetic material in an n-type semiconductor layer or a p-type semiconductor so as to increase magnetic field magnitude within an active layer through magnetization of the n-type semiconductor layer or the p-type semiconductor layer, thereby improving internal quantum efficiency.

Further, the light emitting diode includes magnetic structures disposed not only on an upper side thereof but also on a lower side thereof to increase magnetic field magnitude within the active layer, thereby further improving internal quantum efficiency.

The present invention is not limited to the aforementioned effects, and other effects will become apparent to those skilled in the art from the following description.

BRIEF DESCRIPTION OF THE DRAWINGS

The above and other aspects, features, and advantages of the present invention will become apparent from the detailed description of the following embodiments in conjunction with the accompanying drawings, in which.

DETAILED DESCRIPTION

Hereinafter, embodiments of the present invention will be described in detail with reference to the accompanying drawings.

It should be understood that the following embodiments are provided for illustration only and are not to be construed in any way as limiting the present invention, and that various modifications, changes, alterations, and equivalent embodiments can be made by those skilled in the art without departing from the spirit and scope of the invention. Therefore, the scope of the invention should be limited only by the accompanying claims and equivalents thereof.

It will be understood that when an element such as a layer, film, region or substrate is referred to as being placed "on" another element, it can be directly placed on the other element, or intervening layer(s) may also be present.

Figure 1:
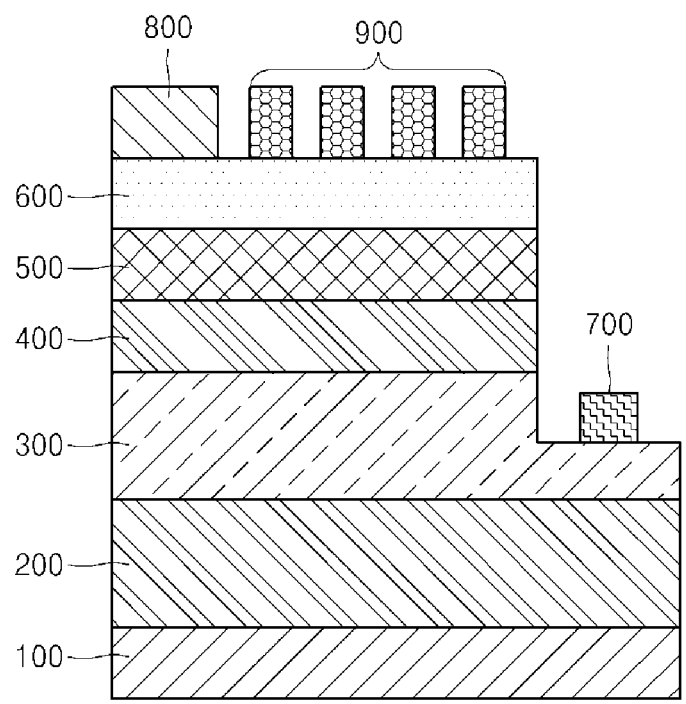
FIG. 1 is a sectional view of a light emitting diode according to one embodiment of the present invention.

Although terms such as first, second and the like may be used to describe various elements, components, areas, layers and/or regions, it will be understood that such terms are not to be construed as limiting such elements, components, areas, layers and/or regions FIG. 1 is a sectional view of a light emitting diode according to one embodiment of the present invention.

Referring to FIG. 1, a light emitting diode according to one embodiment of the invention includes a substrate 100, a buffer layer 200, an n-type semiconductor layer 300, an active layer 400, a p-type semiconductor layer 500, a reflective layer 600, an n-type electrode 700, a p-type electrode 800, and a first patterned magnetic structure 900.

The substrate 100 may include any materials that have predetermined light transmittance and are capable of facilitating growth of the n-type semiconductor layer 300.

For example, when a luminous structure is composed of a GaN-based compound semiconductor or an oxide-based compound semiconductor and has a hexagonal structure, it is desirable that the substrate 100 have a hexagonal crystal structure. Alternatively, the substrate may be provided with a single crystal thin film thereon while having an amorphous or non-hexagonal structure.

In addition, the substrate 100 may be provided with a nano-structure thereon, regardless of a crystal structure thereof. Here, the nano-structure may have a pattern shape.

On the other hand, when the light emitting diode is a flip chip type light emitting diode, the substrate 100 may have light transmissive properties. Such a light transmissive substrate 100 may be formed of a material which transmits visible light. For example, the light transmissive substrate 100 may be a sapphire substrate, a ZnO substrate, a GaN substrate, a SiC substrate, a $LiAl_2O_3$ substrate, or the like, preferably a sapphire substrate.

In addition, when the light emitting diode is a flip chip type light emitting diode, a double side-polished substrate may be used to prevent light scattering on the substrate 100.

The buffer layer 200 is placed on the substrate 100. The buffer layer 200 minimizes lattice mismatch due to a difference in lattice constant between the substrate 100 and the n-type semiconductor layer 300, as described below. However, the buffer layer 200 may be omitted, as needed.

For example, when an n-type GaN layer is formed as an n-type semiconductor layer on a sapphire substrate, an undoped GaN layer (u-GaN layer), as a buffer layer 200, may be formed to a predetermined thickness between the sapphire substrate and the n-type GaN layer to reduce defect density.

The buffer layer 200 may be formed by metal organic chemical vapor deposition (MOCVD), hydride vapor phase epitaxy (HVPE), molecular beam epitaxy (MBE), or the like.

The n-type semiconductor layer 300 is placed on the buffer layer 200. When the buffer layer 200 is omitted, the n-type semiconductor layer 300 may be placed on the substrate 100.

The n-type semiconductor layer 300 may include a GaN-based material, for example, gallium nitride. For the n-type semiconductor layer 300, Group IV elements, for example, Si or Ge may be used as a dopant.

The n-type semiconductor layer 300 may be formed by MOCVD, HVPE, MBE, or the like.

The n-type semiconductor layer 300 may include a dilute magnetic semiconductor (DMS) material.

Such a DMS material is a compound semiconductor that is mainly obtained by substituting a transition metal such as manganese (Mn), cobalt (Co), iron (Fe), and the like for some elements of a Group II-VI or III-V semiconductor, and exhibits changes in magnetic properties such as ferromagnetism or anti-ferromagnetism below a certain temperature, while maintaining basic characteristics of the semiconductor.

Namely, the n-type semiconductor layer 300 may include a ferromagnetic material. For example, the ferromagnetic material may be Co, Fe, Ni, or Mn. The ferromagnetic material included in the n-type semiconductor layer 300 is magnetized in a direction perpendicular or parallel to the substrate 100.

For example, the n-type semiconductor layer 300 may be formed of a DMS material having magnetic properties by MOCVD, MBE, or the like, and then magnetized in the direction perpendicular or parallel to the substrate 100 through magnetization annealing.

Here, the DMS layer may be formed by adding the ferromagnetic material to a thin film. In this case, an n-type dopant and the ferromagnetic material may be added to each other to form the n-type semiconductor layer 300.

Thus, the ferromagnetic material magnetized in this way can further increase the magnitude of a magnetic field formed within the active layer 400 in the direction perpendicular or parallel to the substrate 100 by the first patterned magnetic structure 900 described below.

The active layer 400 is placed on the n-type semiconductor layer 300. The active layer 400 is a region where electrons and holes injected from the n-type semiconductor layer 300 and the p-type semiconductor layer 400 are combined with each other to generate light.

The active layer 400 may be formed of a material having the same crystal structure as the n-type semiconductor layer 300. For example, when the n-type semiconductor layer 300 is formed of a GaN-based material, the active layer 400 may also be formed of a GaN-based material.

The active layer 400 may have a single quantum well structure or a multi-quantum well structure, preferably a multi-quantum well structure.

The multi-quantum well structure refers to a structure wherein quantum barrier layers and quantum well layers are alternately stacked one above another. The quantum barrier layers have higher band-gap than that of the quantum well layers. Thus, quantum confinement effect within the quantum well layers can be efficiently achieved. The quantum barrier layers or quantum well layers are formed by band-gap engineering.

For example, the quantum well layers may include GaN or InGaN layers. In addition, the quantum barrier layers in the multi-quantum well structure may include relatively thick barrier layers, barrier layers having a wider band-gap, or barrier layers doped with p-type impurities.

In the active layer 400, the amount of indium in the quantum barrier layers and the quantum well layers as well as the stacking number of quantum barrier layers and quantum well layers may be arbitrarily determined depending upon a desired emission wavelength.

The active layer 300 may be formed by MOCVD, HVPE, MBE, or the like.

The p-type semiconductor layer 500 is placed on the active layer 400. The p-type semiconductor layer 500 may include a nitride based material, for example, gallium nitride. For the p-type semiconductor layer 500, a Group II element, preferably Mg, is used as a dopant.

The p-type semiconductor layer 500 may be formed by MOCVD, HVPE, MBE, or the like.

On the other hand, the p-type semiconductor layer 500 may include a dilute magnetic semiconductor (DMS) material. In other words, the p-type semiconductor layer 500 may include a ferromagnetic material. The ferromagnetic material is Co, Fe, Ni, or Mn. Details of the ferromagnetic material are the same as described above in relation to the n-type semiconductor layer 300, and a detailed description thereof will be omitted.

The light emitting diode may further include an electron blocking layer (EBL, not shown) interposed between the active layer 400 and the p-type semiconductor layer 500. For example, the electron blocking layer serves to prevent evaporation of InGaN. The electron blocking layer may include AlGaN.

The reflective layer 600 is placed on the p-type semiconductor layer 500. When the light emitting diode is a flip-chip type light emitting diode which emits light through a substrate, the reflective layer 600 allows light to easily pass therethrough towards the substrate, thereby providing improved luminous efficiency.

The reflective layer 600 may be formed of any materials that have high reflectance and can form ohmic contact with the p-type semiconductor layer 500. For example, the reflective layer 600 may include Ag, Al, or alloys thereof. For example, the reflective layer 600 may be composed of a Ni/Ag/Ni layer.

The reflective layer 600 may be formed by electron beam or sputtering.

The n-type electrode 700 is electrically connected to the n-type semiconductor layer 300. For example, the n-type electrode 700 may be placed on an exposed surface of the n-type semiconductor layer 300. In other words, the light emitting diode may have an opening that exposes a portion of the n-type semiconductor layer 300, and the n-type electrode 700 electrically connected to the n-type semiconductor layer 300 may be placed in the opening.

The n-type electrode 700 may be formed of any materials capable of forming ohmic contact with the n-type semiconductor layer 300. The n-type electrode 700 may include one selected from the group consisting of Ni, Cr, W, Rh, In, Au, Sn, Zr, Ta, Al, Ti, and combinations thereof. For example, the n-type electrode 700 may be formed of Ti/Au or Ti/Al.

The p-type electrode 800 is placed on the reflective layer 600. The p-type electrode 800 may be formed of any materials capable of forming ohmic contact with the p-type semiconductor layer 500. The p-type electrode 800 may include one selected from the group consisting of Ni, Cr, W, Rh, In, Au, Sn, Zr, Ta, Al, Ti, and combinations thereof. For example, the p-type electrode 800 may be formed of Cr/Au or Ti/Au.

The first patterned magnetic structure 900 is placed on the reflective layer 800. The first patterned magnetic structure 900 may be separated from the p-type electrode 800.

The first patterned magnetic structure 900 may include at least one ferromagnetic material selected from among Co, Fe, Ni, Gd, Dy, NdFeB, and alloys thereof.

The first patterned magnetic structure 900 may be a line pattern, a hole pattern or a dot pattern. Such a pattern may be formed by various patterning processes known in the art.

In addition, the first patterned magnetic structure 900 is subjected to magnetization annealing. The first magnetic structure 900 is magnetized in the direction perpendicular or parallel to the substrate 100. In magnetization, first, a permanent magnet is placed in an annealing furnace. Then, a magnetic field is generated in a predetermined direction while performing heat treatment under conditions of temperature and time suitable for each of these materials, thereby performing magnetization annealing of a magnetic layer to be magnetized.

For example, the temperature of the annealing furnace is adjusted and an external magnetic field is applied parallel or perpendicular to the substrate such that the magnetic layer can be magnetized in the direction parallel or perpendicular to the substrate.

When a magnetic field is generated by the first patterned magnetic structure 900, the magnetic field can be applied to the active layer 400. Here, the resulting magnetic field has a non-uniform magnitude. Thus, the non-uniform magnitude of the magnetic field generated by the first patterned magnetic structure 900 causes charge carriers including electrons and holes to drift within the active layer 400, thereby causing in-plane spreading.

Such in-plane spreading of electrons and holes can make the electrons and holes more likely to recombine with each other, thereby providing improved internal quantum efficiency.

Further, since the first magnetic structure 900 is a patterned structure, distributions of the non-uniform magnetic field are formed more within the active layer 400, as compared with a film type magnetic structure. Thus, distributions of charge carriers capable of executing spiral motion can be increased.

Thus, the first magnetic structure 900, to which various patterns are applied, can provide further improved internal quantum efficiency than the film type magnetic structure.

In addition, the second magnetic structure (not shown) may be placed under the substrate 100. The second magnetic structure may be a patterned structure. The second magnetic structure is subjected to magnetization annealing. The second magnetic structure is magnetized in the direction perpendicular or parallel to the substrate 100.

The second magnetic structure can further increase the magnitude of the magnetic field generated in the active layer 400 in the direction perpendicular or parallel to the substrate 100 by the first patterned magnetic structure 900.

Hereinafter, motion of electrons and holes in the active layer 400 caused by a magnetic field will be described in more detail.

Figure 2:
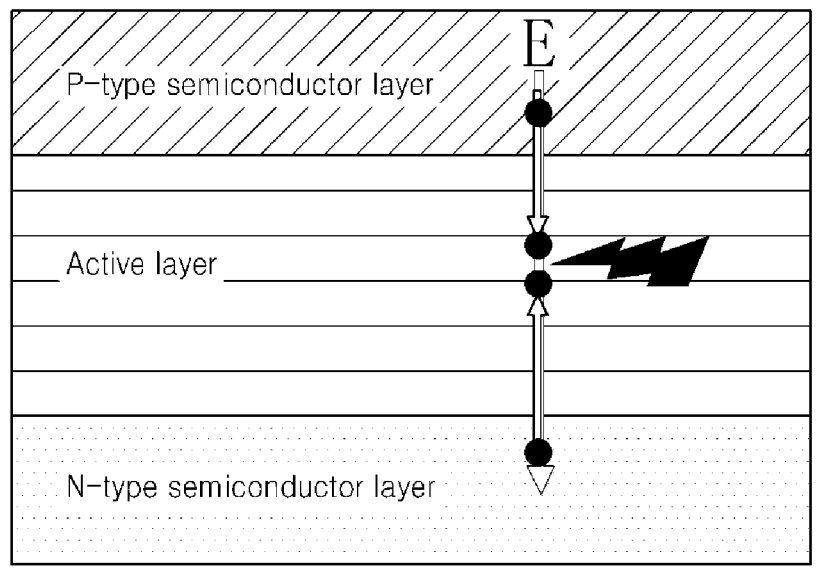
FIGS. 2 and 3 are conceptual views illustrating motion of electrons and holes in an active layer caused by a magnetic field.
Figure 3:
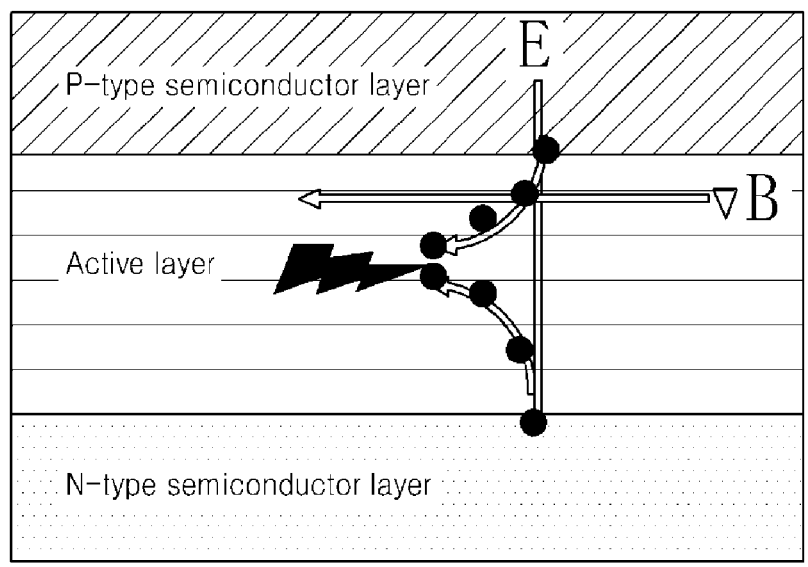

FIGS. 2 and 3 are conceptual views illustrating motion of electrons and holes in an active layer caused by a magnetic field.

FIG. 2 shows the case where the light emitting diode is affected only by an electric field. Referring to FIG. 2, when an electric current is applied to the light emitting diode, electrons and holes execute linear motions by an electric field.

In particular, in a GaN-based light emitting diode, since electrons have higher mobility than holes, the electrons and the holes are less likely to recombine with each other within the active layer, thereby causing low internal quantum efficiency.

FIG. 3 shows the case where the light emitting diode is affected by both an electric field and a magnetic field. Referring to FIG. 3, in-plain spreading of electrons and holes is achieved by a non-uniform magnetic field ($\nabla B$).

Thus, when electric current flows through the light emitting diode and a non-uniform magnetic field is applied in a direction (001) perpendicular to the substrate, a non-uniform distribution of the magnetic field allows electrons and holes to drift, thereby causing localization in the direction parallel to the substrate.

Accordingly, electrons and holes are more likely to recombine with each other within the active layer, thereby providing improved internal quantum efficiency.

Figure 4:
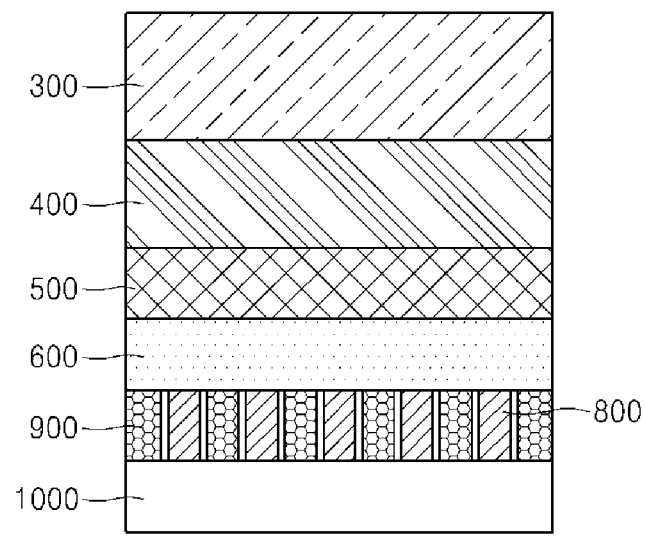
FIG. 4 is a sectional view of a light emitting diode according to another embodiment of the present invention.

FIG. 4 is a sectional view of a light emitting diode according to another embodiment of the present invention.

Referring to FIG. 4, a light emitting diode according to another embodiment of the present invention is a vertical type light emitting diode. The light emitting diode may include a support substrate 1000, a first patterned magnetic structure 900, a p-type electrode 800, a reflective layer 600, a p-type semiconductor layer 500, an active layer 400, an n-type semiconductor layer 300, and an n-type electrode (not shown).

The support substrate 1000 supports the light emitting diode and may be formed of a conductive material. The support substrate may include Si, SiC, GaAs, GaP, AlGaInP, Ge, SiSe, GaN, AlInGaN, or InGaN. If the support substrate includes metal, the support substrate may include Al, Zn, Ag, W, Ti, Ni, Au, Mo, Pt, Cu, Cr, Fe, or alloys thereof.

The first patterned magnetic structure 900 is placed on the support substrate 1000. The first patterned magnetic structure 900 may include at least one ferromagnetic material selected from among Co, Fe, Ni, Gd, Dy, NdFeB, and alloys thereof.

The first patterned magnetic structure 900 may be a line pattern, a hole pattern, or a dot pattern. Such a pattern may be formed by various patterning processes known in the art.

In addition, the first patterned magnetic structure 900 is subjected to magnetization annealing. The first patterned magnetic structure 900 is magnetized in a direction perpendicular or parallel to the support substrate 1000.

Since details of the first patterned magnetic structure 900 are the same as described in FIG. 1, a detailed description thereof will be omitted herein.

The p-type electrode 800 is placed on a surface of the substrate 100 exposed between patterns of the first patterned magnetic structure 900. Thus, the p-type electrode 800 may have a patterned structure and may be separated from the first magnetic structure 900.

The p-type electrode 800 may be formed of any materials capable of forming ohmic contact with the p-type semiconductor layer 500. This p-type electrode 800 may include one selected from the group consisting of Ni, Cr, W, Rh, In, Au, Sn, Zr, Ta, Al, Ti, and combinations thereof. For example, the p-type electrode 800 may be formed of Cr/Au or Ti/Au.

The reflective layer 600 is placed on the first patterned magnetic structure 900 and the p-type electrode 800. The reflective layer 600 may be formed of any materials that have high reflectance and can form ohmic contact with the p-type semiconductor layer 500. For example, the reflective layer 600 may be formed of Ag, Al, or alloys thereof. For example, the reflective layer 600 may be a Ni/Ag/Ni layer.

The p-type semiconductor layer 500 is placed on the reflective layer 600. The active layer 400 is placed on the p-type semiconductor layer 500. The n-type semiconductor layer 300 is placed on the active layer 400.

Since details of the p-type semiconductor layer 500, the active layer 400, and the n-type semiconductor layer 300 are the same as described in FIG. 1 except that these layers are stacked one above another in reverse order, detailed descriptions thereof will be omitted herein.

The n-type electrode is electrically connected to the n-type semiconductor layer 300. Specifically, the n-type semiconductor layer 300, the active layer 400, and the p-type semiconductor layer 500 are sequentially grown on a growth substrate, followed by removing the growth substrate using a lift-off process. Then, the n-type electrode may be formed on the n-type semiconductor layer 300 exposed by removing the growth substrate.

Thus, the vertical light emitting diode can also employ a patterned magnetic structure to provide improved internal quantum efficiency.

Preparative Example 1

Figure 5:
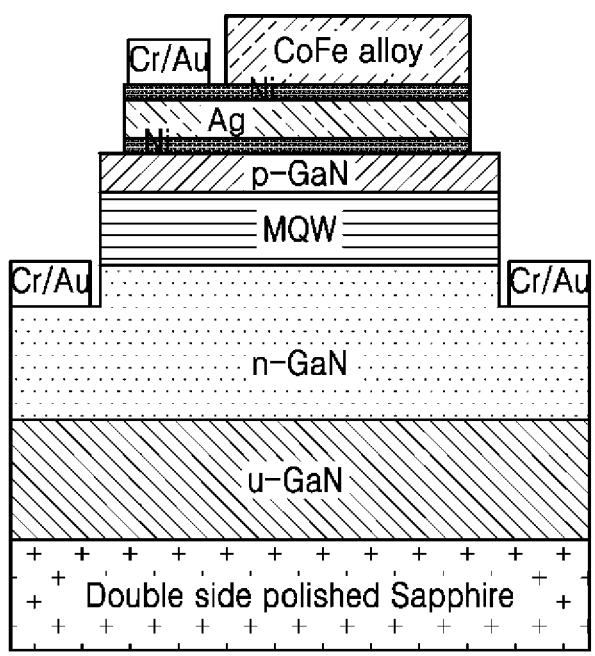
FIG. 5 is a sectional view of a light emitting diode of Preparative Example 1.

FIG. 5 is a sectional view of a light emitting diode prepared in Preparative Example 1. The light emitting diode according to one embodiment of the invention was prepared as shown FIG. 5.

First, a double side-polished sapphire substrate was prepared.

Then, an undoped GaN layer (u-Gan layer), an n-type GaN layer (n-GaN layer), a multi-quantum well layer (MQW), a p-type GaN layer (p-GaN layer), and a reflective layer (Ni/Ag/Ni layer) were sequentially grown on the sapphire substrate by MOCVD.

Then, a mesa pattern was formed on the p-GaN layer using photoresist, followed by mesa etching the p-GaN layer using ion coupled plasma (ICP) until a portion of the n-GaN layer was exposed. $Cl_2/H_2/CH_4/Ar$ was used as an etching gas.

Then, a film type CoFe alloy magnetic structure was formed on the reflective layer by electron beam deposition.

Then, the CoFe alloy layer was subjected to magnetization annealing.

For magnetization annealing, the light emitting diode having the film type CoFe alloy layer was placed in an annealing furnace, heated to 180° C., maintained at 180° C. for 1 hour, and slowly cooled to room temperature.

Here, an electromagnet was placed outside the annealing furnace such that an external magnetic field could be applied perpendicularly to the substrate to allow the CoFe alloy layer to be magnetized in a direction perpendicular to the substrate.

As a result, the magnetized magnetic structure could generate a magnetic field within the active layer in the direction perpendicular to the substrate.

Figure 6:
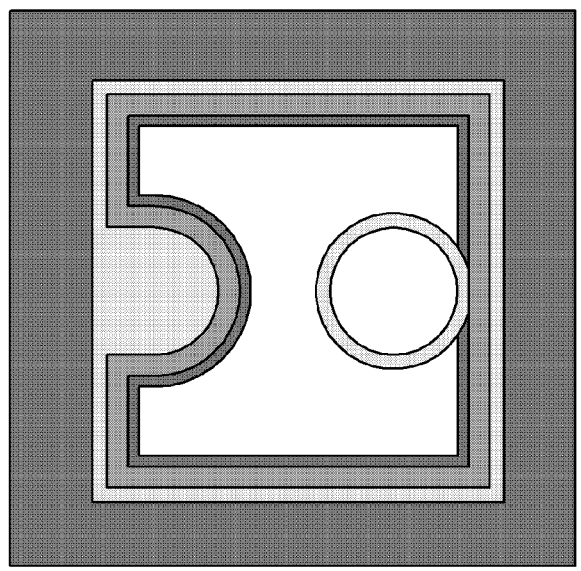
FIG. 6 is a top image of the light emitting diode of Preparative Example 1.

FIG. 6 is a top image of the light emitting diode prepared in Preparative Example 1. Referring to FIG. 6, it can be seen that the magnetic layer is placed at an upper portion of the light emitting diode.

Preparative Example 2

Figure 7:
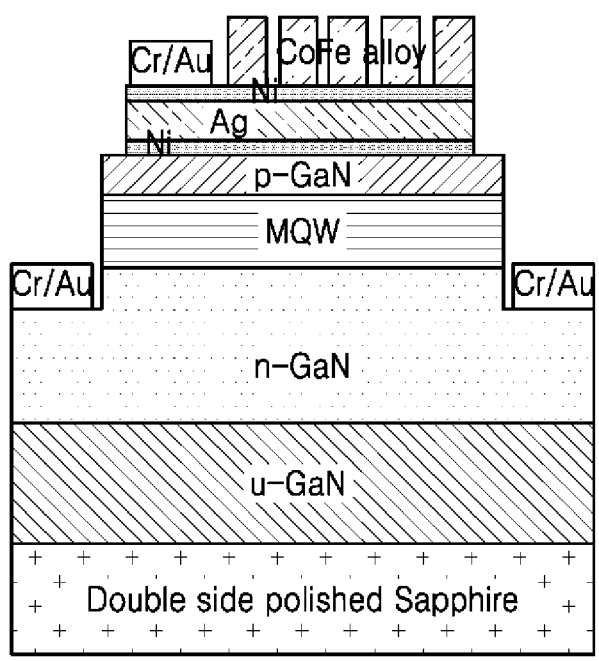
FIG. 7 is a sectional view of a light emitting diode of Preparative Example 2.

FIG. 7 is a sectional view of a light emitting diode prepared in Preparative Example 2. The light emitting diode according to one embodiment of the invention was prepared as shown FIG. 5.

A light emitting diode was prepared in the same manner as in Preparative Example 1 except that a first patterned magnetic structure was formed by patterning the magnetic structure placed at an upper portion of the light emitting diode. The first magnetic structure had a dot pattern.

Figure 8:
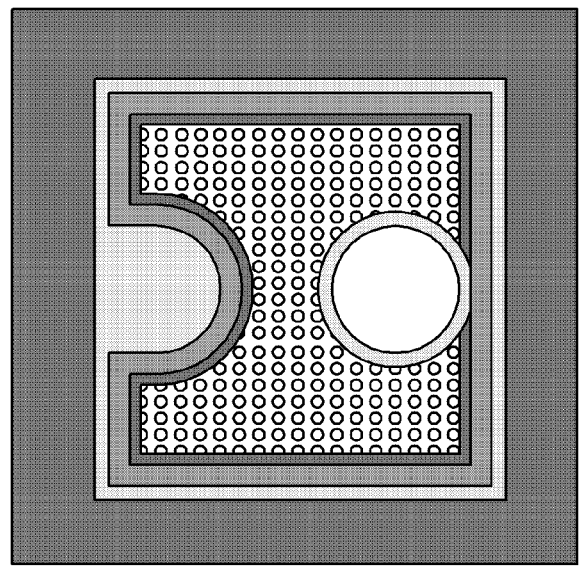
FIG. 8 is a top image of the light emitting diode of Preparative Example 2.

FIG. 8 is a top image of the light emitting diode prepared in Preparative Example 2. Referring to FIG. 8, it can be seen that the patterned magnetic structure is placed at the upper portion of the light emitting diode.

Comparative Example 1

A light emitting diode was prepared in the same manner as in Preparative Example 1 except that a magnetic structure was not formed at an upper portion of the light emitting diode.

Comparative Example 2

A light emitting diode was prepared in the same manner as in Preparative Example 2 except that magnetization annealing was not carried out.

Experimental Example 1

Properties of the light emitting diodes prepared in Preparative Example 1, Preparative Example 2, and Comparative Example 1 were measured.

Figure 9:
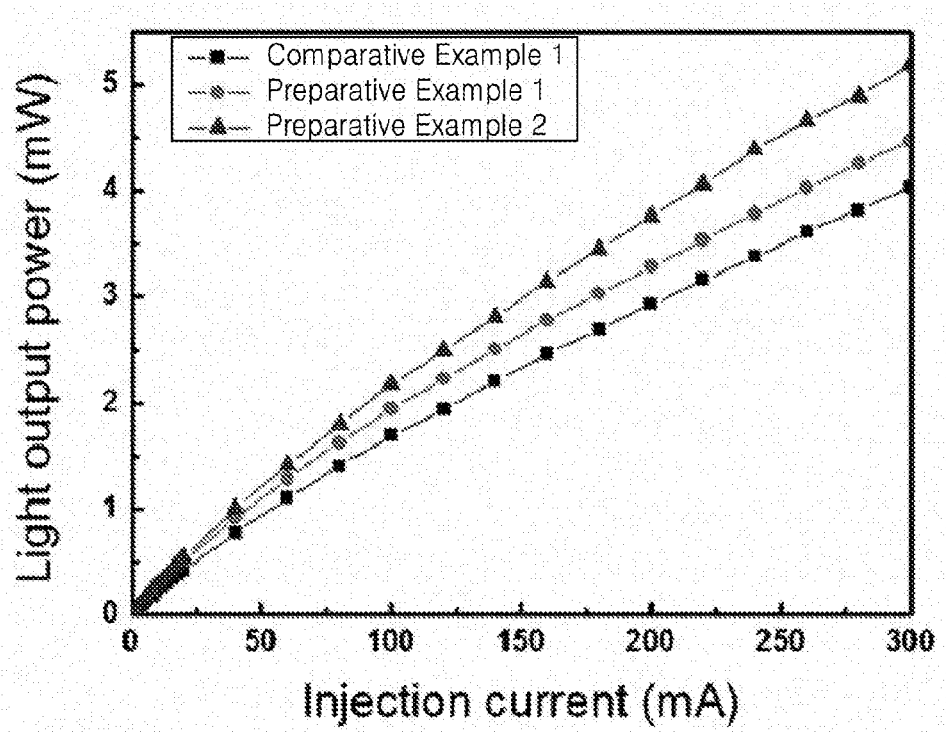
FIG. 9 is a graph showing optical output properties of the light emitting diodes of Preparative Example 1, Preparative Example 2, and Comparative Example 1.

FIG. 9 is a graph for showing optical output properties of the light emitting diodes prepared in Preparative Example 1, Preparative Example 2, and Comparative Example 1.

Referring to FIG. 9, optical power of the light emitting diode having a film type magnetic structure (Preparative Example 1) was increased by 20% as compared with the light emitting diode having no magnetic structure (Comparative Example 1).

In addition, optical power of the light emitting diode having a dot-patterned magnetic structure (Preparative Example 2) was increased by 28% as compared with the light emitting diode having no magnetic structure (Comparative Example 1).

From these results, it could be seen that, by virtue of a film-type or dot-patterned magnetic structure, charge carriers are more likely to be present in the active layer and thus more electrons and holes recombine with each other than a typical light emitting diode having no magnetic structure.

Furthermore, it can be ascertained that the patterned magnetic structure provides better optical power than a film type magnetic structure.

In the film type magnetic structure, although a non-uniform magnetic field is applied to the active layer, the non-uniform magnetic field has a simple distribution, thereby making it difficult to maximize localization of charge carriers. On the contrary, when the magnetic structure is a dot pattern, distributions of a non-uniform magnetic field applied to the active layer from the magnetic structure can be greatly increased.

Experimental Example 2

Properties of the light emitting diodes of Preparative Example 2 and Comparative Example 2 were measured.

Figure 10:
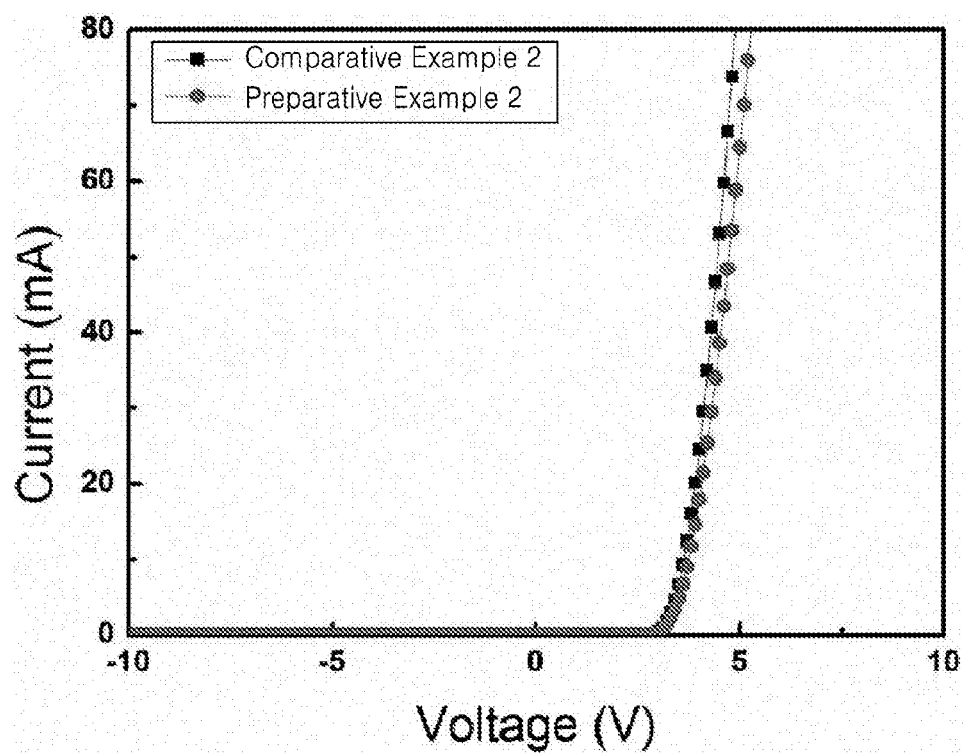
FIG. 10 is a voltage vs current curve of the light emitting diodes of Preparative Example 2 and Comparative Example 2.

FIG. 10 is a voltage vs current curve of the light emitting diodes of Preparative Example 2 and Comparative Example 2.

Referring to FIG. 10, it could be seen that a forward voltage at 20 mA was 3.9 V in the light emitting diodes of both Preparative Example 2 and Comparative Example 2.

In addition, in the light emitting diode having a dot-patterned CoFe magnetic structure (Preparative Example 2), charge carriers drifted due to the non-uniform magnetic field. As a result, series resistance was increased from 14.5Ω to 17.5 Ω.

Figure 11:
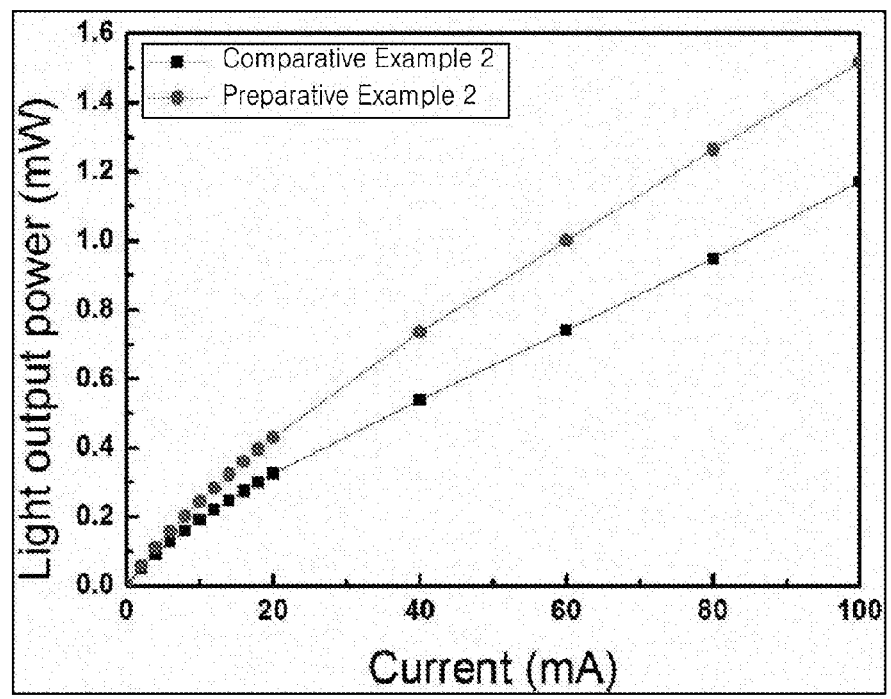
FIG. 11 is a graph showing optical output properties of the light emitting diodes of Preparative Example 2 and Comparative Example 2.

FIG. 11 is a graph showing optical output properties of the light emitting diodes of Preparative Example 2 and Comparative Example 2.

Referring to FIG. 11, it could be seen that charge carriers were quickly confined in a localized state to increase radiative recombination rate and thus optical power at 20 mA was improved by 31%.

It could be ascertained that the optical power at 20 mA was improved by about 31% in the light emitting diode subjected to magnetization annealing (Preparative Example 2), as compared with the light emitting diode not subjected to magnetization annealing (Comparative Example 2), and the difference in optical power was increased with increasing applied voltage.

This results from the fact that charge carriers were quickly confined in a localized state, thereby increasing the radiative recombination rate.

Figure 12:
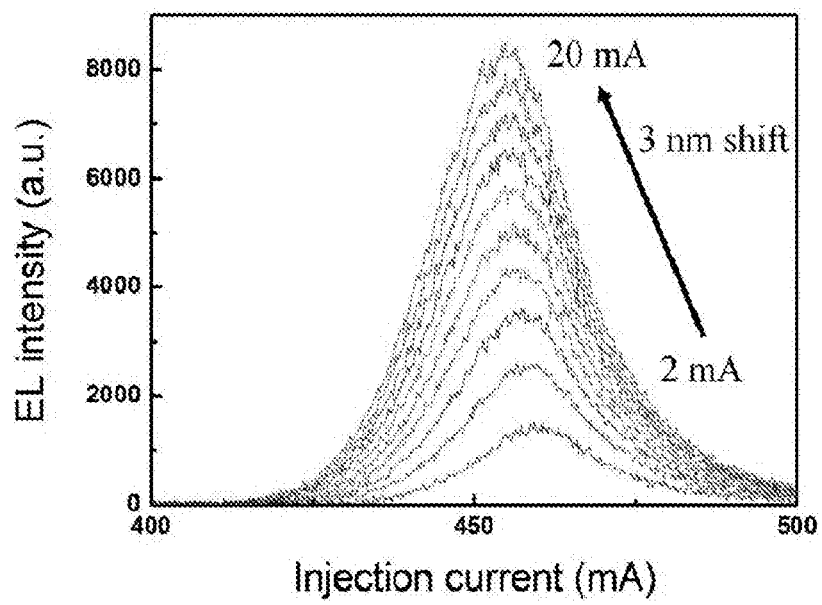
FIG. 12 is an EL spectra graph of the light emitting diode of Comparative Example 2.
Figure 13:
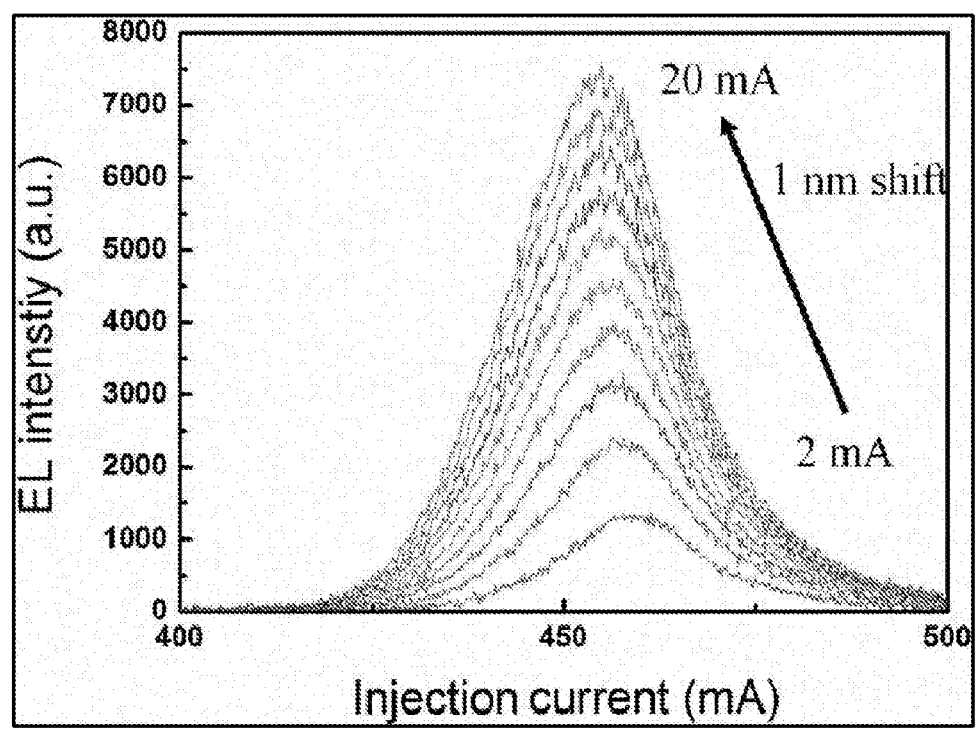
FIG. 13 is an EL spectra graph of the light emitting diode of Preparative Example 2.

FIG. 12 is an EL spectra graph of the light emitting diode of Comparative Example 2, and FIG. 13 is an EL spectra graph of the light emitting diode of Preparative Example 2.

Referring to FIGS. 12 and 13, it could be seen that charge carriers were more quickly confined in potential minima of a localized state in the light emitting diode subjected to magnetization annealing (Preparative Example 2), as compared with the light emitting diode not subjected to magnetization annealing (Comparative Example 2), and thus exhibited low blue shift as compared with the light emitting diode not subjected to magnetization annealing.

Although the present invention has been described with reference to some embodiments in conjunction with the accompanying drawings, it should be understood that the foregoing embodiments are provided for illustration only and are not to be construed in any way as limiting the present invention, and that various modifications, changes, alterations, and equivalent embodiments can be made by those skilled in the art without departing from the spirit and scope of the invention.

What is claimed is:

1. A light emitting diode comprising:
   a substrate;
   an n-type semiconductor layer placed on the substrate;
   an active layer placed on the n-type semiconductor layer;
   a p-type semiconductor layer placed on the active layer;
   a reflective layer placed on the p-type semiconductor layer;
   an n-type electrode electrically connected to the n-type semiconductor layer;
   a p-type electrode placed on the reflective layer; and
   a first patterned magnetic structure placed on the reflective layer and separated from the p-type electrode.

2. The light emitting diode according to claim 1, wherein the first patterned magnetic structure comprises at least one ferromagnetic material selected from among Co, Fe, Ni, Gd, Dy, NdFeB, and alloys thereof.

3. The light emitting diode according to claim 1, wherein the first patterned magnetic structure is a line pattern, a hole pattern, or a dot pattern.

4. The light emitting diode according to claim 3, wherein the first patterned magnetic structure is subjected to magnetization annealing.

5. The light emitting diode according to claim 4, wherein the first patterned magnetic structure is magnetized in a direction perpendicular or parallel to the substrate.

6. The light emitting diode according to claim 1, wherein at least one of the n-type semiconductor layer and the p-type semiconductor layer comprises a ferromagnetic material.

7. The light emitting diode according to claim 6, wherein the ferromagnetic material comprises at least one selected from the group consisting of Co, Fe, Ni, and Mn.

8. The light emitting diode according to claim 1, further comprising: a second magnetic structure placed under the substrate.

9. The light emitting diode according to claim 1, wherein the second magnetic structure has a patterned structure.

10. A light emitting diode comprising:
   a support substrate;
   a first patterned magnetic structure placed on the support substrate;
   a p-type electrode placed on the support substrate exposed between patterns of the first patterned magnetic structure;
   a reflective layer placed on the first patterned magnetic structure and the p-type electrode;
   a p-type semiconductor layer placed on the reflective layer;
   an active layer placed on the p-type semiconductor layer;
   an n-type semiconductor layer placed on the active layer; and
   an n-type electrode electrically connected to the n-type semiconductor layer.

11. The light emitting diode according to claim 10, wherein the first patterned magnetic structure comprises at least one ferromagnetic material selected from among Co, Fe, Ni, Gd, Dy, NdFeB, and alloys thereof.

12. The light emitting diode according to claim 10, wherein the first patterned magnetic structure is subjected to magnetization annealing.

* * * * *